(12) United States Patent
Kim et al.

(10) Patent No.: US 8,004,186 B2
(45) Date of Patent: Aug. 23, 2011

(54) WHITE AND COLOR PHOTOEXCITATION LIGHT EMITTING SHEET AND METHOD FOR THE FABRICATION THEREOF

(75) Inventors: Jai Kyeong Kim, Seoul (KR); Dong Young Kim, Seoul (KR); Seong Mu Jo, Seoul (KR); Jung Soo Park, Seoul (KR); June Whan Choi, Seoul (KR); Dae Seok Na, Daegu (KR); Byung Hong Yi, Busan (KR); Jae Hyun Lim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 230 days.

(21) Appl. No.: 12/321,853

(22) Filed: Jan. 26, 2009

(65) Prior Publication Data
US 2009/0212695 A1 Aug. 27, 2009

(30) Foreign Application Priority Data
Feb. 25, 2008 (KR) .................. 10-2008-0016880

(51) Int. Cl.
*H01J 1/62* (2006.01)
(52) U.S. Cl. ...................... 313/506; 313/498
(58) Field of Classification Search .......... 313/498, 313/506, 512
See application file for complete search history.

(56) References Cited

U.S. PATENT DOCUMENTS
| 5,910,390 | A | 6/1999 | Hatanaka |
| 6,623,324 | B2 | 9/2003 | Tanaka |
| 2007/0031685 | A1 | 2/2007 | Ko |

FOREIGN PATENT DOCUMENTS
| JP | 09-244253 A | 9/1997 |
| JP | 2002-124379 A | 4/2002 |
| JP | 2009-149787 A | 7/2009 |
| JP | 2010-509735 A | 3/2010 |
| KR | 10-2007-0008852 A | 1/2007 |
| KR | 10-0723681 B1 | 5/2007 |
| WO | WO 2008/063866 A1 | 5/2008 |

OTHER PUBLICATIONS

Benjamin C. Krummacher, et al., "Highly efficient white organic light-emitting diode," Mar. 14, 2006, Applied Physics Letters 88, 113506-1 to 113506-3, American Institute of Physics.
Korean Notice of Allowance dated Nov. 11, 2010.
Japanese Office Action dated Dec. 7, 2010.

*Primary Examiner* — Vip Patel
(74) *Attorney, Agent, or Firm* — Jones Day

(57) ABSTRACT

The present invention relates to a white and color photoexcitation light emitting sheet comprising a substrate, a light source formed on the substrate, and a white and color photoexcitation light emitting layer capable of converting a light emitted from the light source into a light having a different wavelength, where the white and color photoexcitation light emitting layer is fabricated by mixing a matrix polymer, white and color photoexcitation light emitting materials and a solvent, spinning the resulting mixture to prepare an ultrafine composite fiber layer of the matrix polymer/photoexcitation light emitting materials, and thermocompressing the ultrafine composite fiber layer; and a method for fabrication thereof. The white and color photoexcitation light emitting sheet according to the present invention has uniform brightness and color coordinates and exhibits high color reproducibility.

6 Claims, 4 Drawing Sheets
(2 of 4 Drawing Sheet(s) Filed in Color)

WHITE AND COLOR PHOTOEXCITATION LIGHT EMITTING SHEET AND METHOD FOR THE FABRICATION THEREOF

The present application claims priority from Korean Patent Application No. 10-2008-16880, filed Feb. 25, 2008, the subject matter of which is incorporated herein by reference.

FIELD OF THE INVENTION

The present invention relates to a white and color photoexcitation light emitting sheet comprising a photoexcitation light emitting layer which is composed of white and color photoexcitation light emitting materials capable of converting a light emitted from a light source into a light having a different wavelength and a matrix polymer for maintaining sheet morphology; and a method for the fabrication thereof.

BACKGROUND OF THE INVENTION

From the time incandescent lamps were first invented by Thomas Edison, significant research has been conducted to develop a new light source. Currently, various kinds of lightings have been used for providing light on a dark area and illuminating an object. Such lightings are based on the generation of light by converting electrical energy into light energy and currently include, in general, incandescent lamps, mercury lamps, and fluorescent lamps. However, the above light sources have several disadvantages such as high power consumption and short durability requiring frequent replacement.

Further, as the significance of environmental issues is increasingly being recognized, incandescent lamps and mercury lamps may be classified as environment-threatening hazardous materials due to the use of mercury which is a human carcinogen. Those light sources are also problematic in that they require a large installation space, it is very complicated to install them, it is difficult to control their color, and their application in various fields is very limited because of their properties as point light sources.

Recently, various types of alternative light sources are being developed in order to overcome the above-mentioned problems. Representative examples include light sources using LED (light emitting diode) or OLED (organic light emitting diode). Since the above light sources utilize light having a longer wavelength than ultraviolet light, they are harmless to human beings, have a long life-span and are environmentally favorable. Further, they can be applied to various light sources including LCD backlights, room lamps, and the like.

However, because of the complicated production process and high production cost, white LEDs and white OLEDs have a fairly limited scope of application. In the case of white LED, while a great deal of research on developing photoexcitation light emitting sheets for converting a blue LED into a white light has been carried out, there have been problems with respect to its application to large area light sources due to its utilization of a point light source, as well as the generation of heat during operation. As for white OLED, it has received attention as a light source appropriate for human eyesight since it is a surface light source and has wide color coordinates, but still has problems in terms of development of raw materials and life-span.

In the fabrication of conventional photoexcitation light emitting sheets, several dispersion methods including ultrasonication dispersion, mechanical dispersion (stirrer, homogenizer, etc), electrostatic dispersion (dispersing agents, charge control agents, surfactants, etc) and the like have been used for uniformly dispersing and mixing light emitting materials in a solution, but homogeneous dispersion and mixing cannot be maintained by such methods. Further, even if homogeneous dispersion and mixing are achieved, it is impossible to form a uniform film when fabricating a light emitting sheet by conventional methods in the art including spin casting, screen printing, bar coating, doctor blade and the like, due to a difference in density and surface energy and local evaporation of a solvent. Thus fabricated light emitting sheet having a local difference in thickness exhibits non-uniform brightness and color coordinates, which is problematic for commercialization. Additionally, because the formation of such a non-uniform film causes a falling-off in color reproducibility of white and color light sources, it is not easy to regulate color coordination. Further, the fabricated light emitting sheets have low thermoresistance and are susceptible to morphological changes at high temperatures, resulting in limited applicability.

SUMMARY OF THE INVENTION

The present invention is directed to overcoming these deficiencies in the art. One of the objectives of the present invention is to provide a method of applying a photoexcitation light emitting sheet to a light source having a single ultraviolet wavelength or a single blue wavelength so as to fabricate a white and color surface light source.

In order to achieve the above objective, the present invention provides a white and color photoexcitation light emitting sheet comprising a substrate, a light source formed on the substrate, and a white and color photoexcitation light emitting layer capable of converting a light emitted from the light source into a light having a different wavelength, where the white and color photoexcitation light emitting layer is formed by mixing a matrix polymer, white and color photoexcitation light emitting materials and a solvent, spinning the resulting mixture to prepare an ultrafine composite fiber layer of the matrix polymer/photoexcitation light emitting materials, and thermocompressing the ultrafine composite fiber layer.

Another aspect of the present invention relates to a method of fabricating the above white and color photoexcitation light emitting sheet, comprising the following steps of:

1) preparing a white and color photoexcitation light emitting composition by mixing a matrix polymer, white and color photoexcitation light emitting materials and a solvent;

2) spinning the white and color photoexcitation light emitting composition onto a substrate to form an ultrafine composite fiber layer of the matrix polymer/photoexcitation light emitting materials; and 3) thermocompressing the ultrafine composite fiber layer formed on the substrate to form a white and color photoexcitation light emitting layer.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

The embodiments of the present invention will be described in detail with reference to the following drawings.

10: glass substrate or plastic substrate, 11: electrode or conductive material, 20: photoexcitation light emitting layer.

Figure 2:
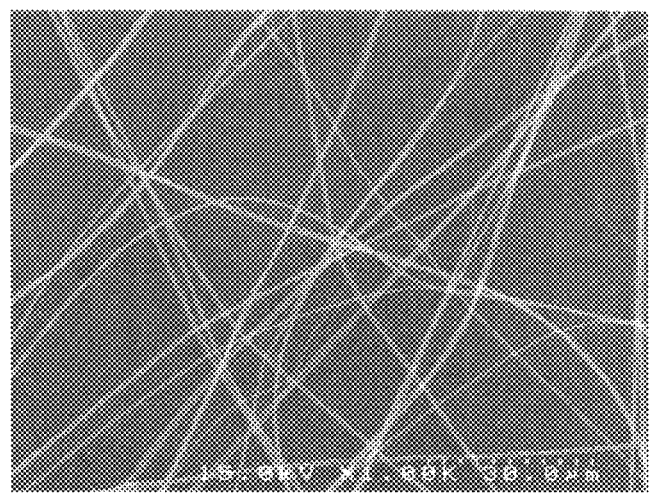

FIG. 2 shows a scanning electron microscope (SEM) photograph of the surface of an ultrafine composite fiber layer electrospun according to the present invention.

Figure 3:
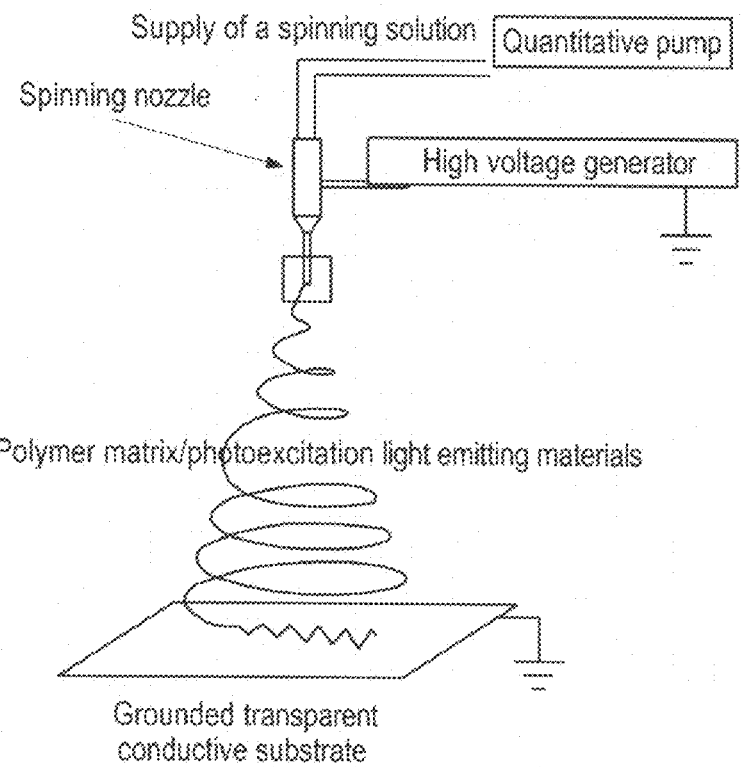

FIG. 3 is a schematic diagram illustrating an electrospinning device used in the present invention.

Figure 4:
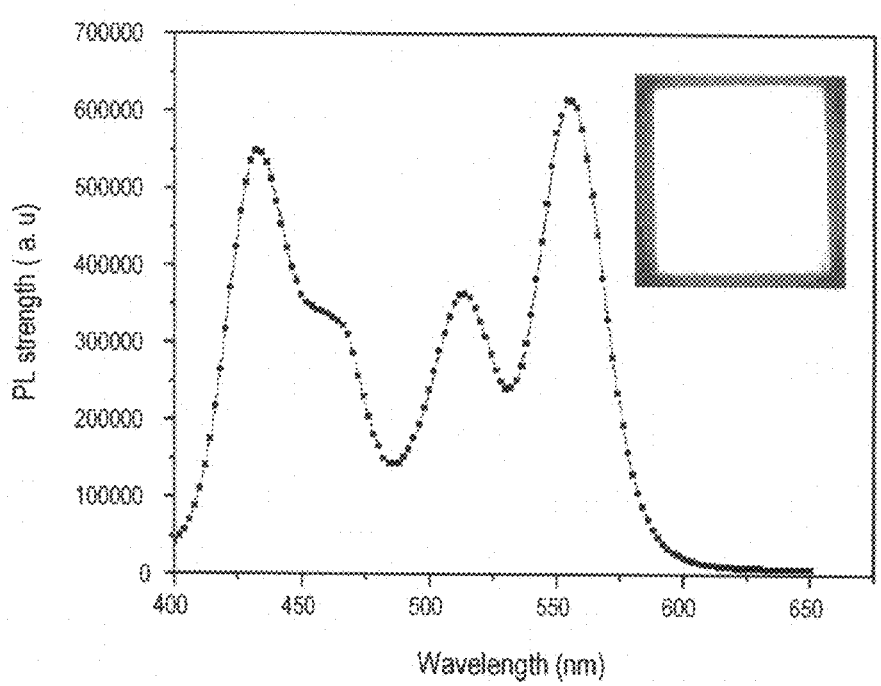

FIG. 4 is an electronic emission spectrum of the photoexcitation light emitting sheet using an ultraviolet light source according to the present invention.

Figure 5:
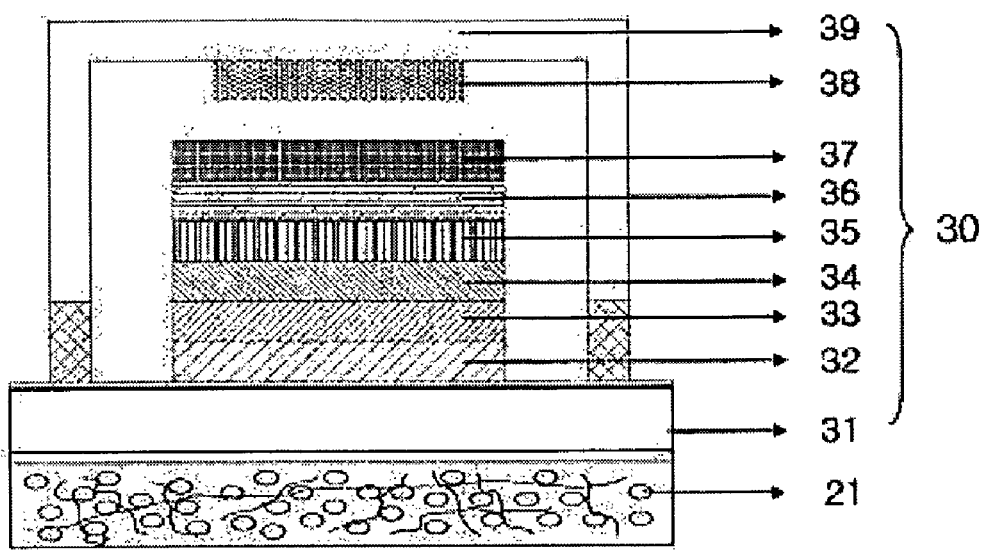

FIG. 5 is a schematic diagram illustrating a light emitting device where the photoexcitation light emitting sheet according to the present invention is applied to a light source of an organic light emitting device.

21: photoexcitation diffusion light emitting material, 30: organic light emitting device, 31: cathode substrate, 32: hole injection layer, 33: hole transport layer, 34: light emitting layer, 35: electron transport layer, 36: electron injection layer, 37: anode layer, 38: humectant, 39: protective film substrate.

Figure 6:
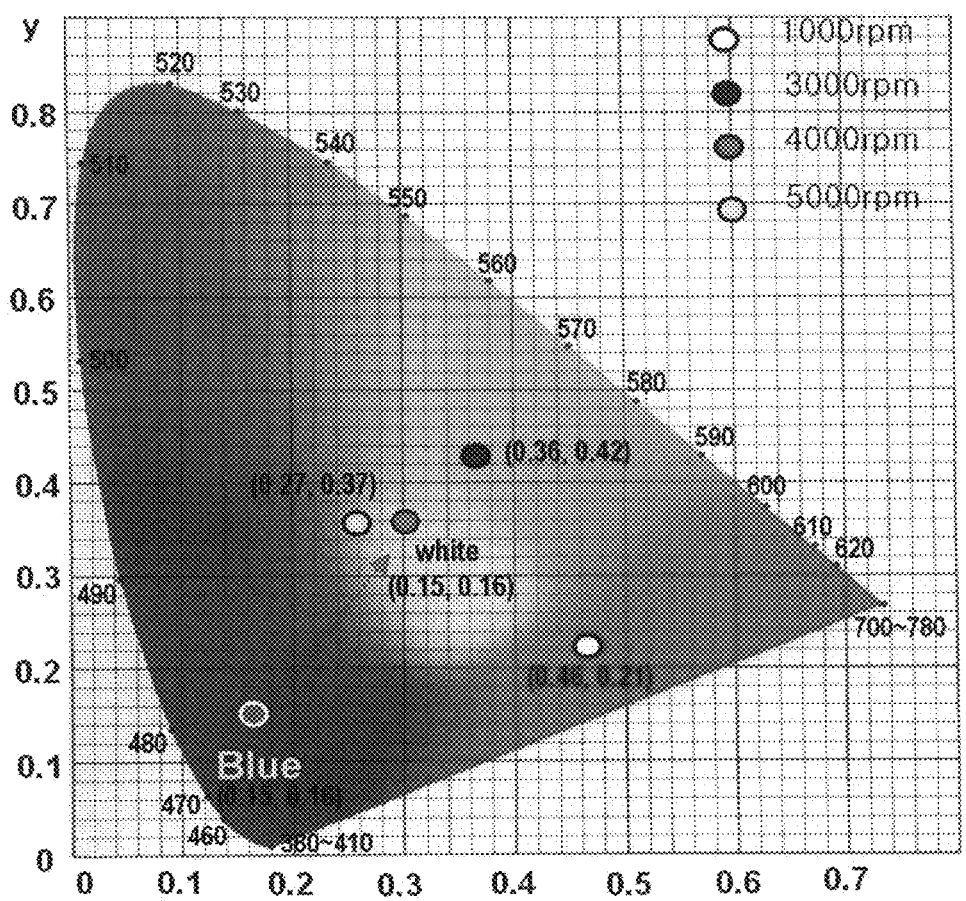

FIG. 6 depicts color coordinates of a white light emitting device where the photoexcitation light emitting sheet according to the present invention is applied to a blue light source of a blue organic light emitting device.

DETAILED DESCRIPTION OF THE INVENTION

The objective of the present invention is to provide a method of applying a photoexcitation light emitting sheet to a light source having a single ultraviolet wavelength or a single blue wavelength so as to fabricate a white and color surface light source. The present invention provides a method that (1) is capable of preparing a photoexcitation light emitting composition with a high thermoresistance in which light emitting materials are homogeneously mixed and dispersed, (2) is capable of forming an ultrafine composite fiber layer by using the above composition, and thereby, fabricate a photoexcitation light emitting sheet having regular thickness and high color reproducibility, which provides uniform brightness and color coordinates, and (3) is capable of using various kinds of colors including the primary colors of red, blue and green, complementary colors and the like and provides a white and color surface light source which absorbs and emits light by selecting the type of light emitting materials depending on the kind of light source having a single ultraviolet wavelength or a single blue wavelength and regulating their composition ratio.

The white and color photoexcitation light emitting sheet of the present invention comprises a substrate, a light source formed on the substrate, and a white and color photoexcitation light emitting layer capable of converting a light emitted from the light source into a light having a different wavelength, where the white and color photoexcitation light emitting layer is formed by mixing a matrix polymer, white and color photoexcitation light emitting materials and a solvent, spinning the resulting mixture to prepare an ultrafine composite fiber layer of the matrix polymer/photoexcitation light emitting materials, and thermocompressing the ultrafine composite fiber layer.

The white and color photoexcitation light emitting sheet of the present invention is based on the principle that it absorbs a part of the light emitted from a light source having a single ultraviolet (UV) wavelength or a single blue wavelength, converts the absorbed light into a light having a different wavelength and emits the same. Meanwhile, the rest of the light emitted from the light source is allowed to penetrate the light emitting sheet of the present invention.

The term "photoexcitation light emitting material" as used herein refers to a material which can maximize the light-guiding effect that converts a point light source or a line light source into a surface light source, as well as light efficiency, and improve light uniformity.

In the case of using a light source having a single ultraviolet wavelength, when the light emitting sheet of the present invention comprising the photoexcitation light emitting materials is irradiated by UV emitted from the light source, the light excited by the blue light emitting material exhibits the wavelength for blue light, the light excited by the red light emitting material exhibits the wavelength for red light, and the light excited by the green light emitting material exhibits the wavelength for green light. When each wavelength and strength is combined appropriately, the white and color light are generated.

In the case of using a light source having a single blue wavelength, when the light emitting sheet of the present invention comprising the photoexcitation light emitting materials is irradiated by blue light emitted from the light source, while the light excited by red light emitting material exhibits the wavelength for red light and the light excited by green light emitting material exhibits the wavelength for green light, the light having a blue light wavelength remains in its unexcited state, and then, is allowed to penetrate the sheet as it is. When each wavelength and strength is combined appropriately, the white and color light are generated.

The white and color photoexcitation light emitting sheet of the present invention will be described hereinafter in more detail.

Figure 1:
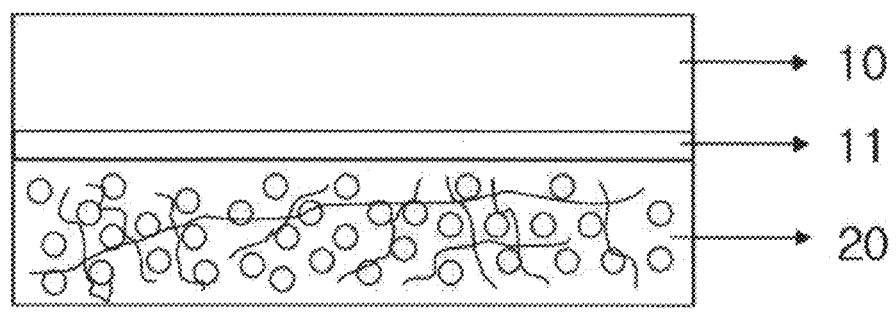
FIG. 1 is a schematic diagram illustrating a white and color photoexcitation light emitting sheet according to the present invention.

Referring to FIG. 1, the white photoexcitation light emitting sheet according to one embodiment of the present invention is comprised of a substrate 10 on which an electrode or a conductive material 11 is coated, and a white and color photoexcitation light emitting layer 20.

Suitable substrates 10 for the present invention may include a transparent conductive substrate, which may be in the form of a transparent glass substrate or a transparent flexible polymer substrate with a coating of conductive thin film. Here, the conductive thin film may be a thin film coated with ITO (indium tin oxide), FTO (fluorine-doped tin oxide), ITO/ATO (antimony tin oxide), or ITO/FTO.

Suitable light sources for the present invention may include a lamp or a light emitting device including an organic light emitting device (OLED) and an inorganic light emitting device (LED), which are capable of emitting a light source having a single ultraviolet wavelength or a single blue wavelength.

The white and color photoexcitation light emitting layer 20 can be formed by dissolving white and color photoexcitation light emitting materials capable of converting a light emitted from the light source into a light having a different wavelength and a matrix polymer for maintaining sheet morphology in a solvent and dispersing them, spinning the resulting mixture onto the substrate so as to form an ultrafine composite fiber layer of the matrix polymer/photoexcitation light emitting materials, and thermocompressing the ultrafine composite fiber layer.

Suitable photoexcitation light emitting materials for the present invention may include, but are not limited to, inorganic fluorescent materials, organic fluorescent materials, organic light emitting polymers, phosphor materials as a metal complex, quantum dots or their composite materials, and mixtures thereof, all having various wavelengths such as blue, green, red, and orange wavelengths. Further, the quantum dot composite materials may include cadmium selenide (CdSe), cadmium sulfide (CdS), zinc selenide (ZnSe), zinc sulfide (ZnS), and zinc oxide (ZnO), but are not limited thereto.

In addition, suitable matrix polymers for the present invention may be selected from the group consisting of polyurethane (PU), polyetherurethane, polyurethane copolymer, cellulose acetate, cellulose acetate butyrate, cellulose acetate propionate, polymethyl acrylate (PMA), polymethyl methacrylate (PMMA), polyacryl copolymer, polyvinylacetate (PVAc), polyvinylacetate copolymer, polyvinylalcohol (PVA), polyfurfurylalcohol (PPFA), polystyrene (PS), polystyrene copolymer, polyethylene oxide (PEO), polypropylene oxide (PPO), polyethyleneoxide copolymer, polypropylene oxide copolymer, polycarbonate (PC), polyvinylchloride (PVC), polycaprolactone (PCL), polyvinylpyrrolidone (PVP), polyvinylcarbazole (PVK), polyvinylidenefluoride (PVdF), polyvinyllidenefluoride copolymer, polyamide, and any mixtures thereof.

Further, suitable solvents for the present invention may be selected from the group consisting of water, ethanol, methanol, acetone, tetrahydrofuran (THF), trifluorethylene, tetrachloroethylene (PCE), benzene, toluene, xylene, hexane, cyclohexane, kerosene, chloroform, trichloethylene, tetrachloethylene, dimethylformamide, and any mixtures thereof.

Specifically, the ultrafine composite fiber formed by spinning the mixture of the white and color photoexcitation light emitting materials, matrix polymer and solvent onto the substrate has a diameter ranging from 10 to 10,000 nm. If the diameter of the ultrafine composite fiber is not more than 10 nm, the light emitting materials are excessively present on the surface of the ultrafine composite fiber, resulting in an inhibition of the protective effect of the matrix polymer and causing problems such as decreased brightness and excessive time for light emitting sheet formation. On the other hand, if the diameter of the ultrafine composite fiber exceeds 10,000 nm, the light emitting sheet is formed by only a few composite fiber layers, leading to a decrease in uniformity and brightness.

Specifically, thermocompression of the ultrafine composite fiber layer is carried out for 30 seconds to 10 minutes at a temperature between the glass transition temperature (Tg) of the matrix polymer and the melting temperature (Tm) thereof, which is lower than 150° C. Further, during the thermocompression, a compression ratio is preferably in the range of 0.1 ton/100 cm² to 20 ton/100 cm². A part of or the whole matrix polymer in the ultrafine composite fiber layer is melted by such thermocompression, and the ultrafine composite fibers are pulverized. As such, the adhesiveness between the pulverized fibers and the substrate is improved, and thereby, a white and color photoexcitation light emitting layer having an enlarged specific surface area is fabricated.

Specifically, thus formed white and color photoexcitation light emitting layer has a thickness ranging from 0.5 to 20 μm. If the thickness of the white and color photoexcitation light emitting layer is not more than 0.5 μm, the light emitting layer cannot absorb light emitted from the light source, and thus, it is impossible for photoexcitation to occur. On the other hand, if the thickness of the white and color photoexcitation light emitting layer exceeds 20 μm, there are problems in that light emitted from the light source cannot penetrate through the light emitting layer.

According to one embodiment of the present invention, a white photoexcitation light emitting sheet is fabricated by using a blue light emitting polymer, a green light emitting quantum dot, and an orange wavelength quantum dot as photoexcitation light emitting materials; polymethyl methacrylate (PMMA) as a matrix polymer; and toluene as a solvent.

As a result of examining the electronic emission spectrum of the white photoexcitation light emitting sheet according to the present invention, it has been found that, when a UV light source having a wavelength of 365 nm is applied, three peaks are detected at 433 nm, 517 in and 556 nm, respectively, white light is emitted, and white color coordinates located at (x=0.31, y=0.276) were exhibited (see FIGS. 4 and 6).

In the white and color photoexcitation light emitting sheet according to the present invention, the brightness and color coordinates can be regulated by various methods, as follows.

First, the brightness of the photoexcitation light emitting sheet can be modulated by regulating the content ratio of each photoexcitation light emitting material and matrix polymer in the photoexcitation light emitting composition for spinning. If the content ratio of the matrix polymer is relatively high, the concentration of the photoexcitation light emitting materials decreases, resulting in a reduction of the photoexcitation and diffusion of the light emitting sheet, and thereby deteriorating the entire brightness of the light emitting layer. On the other hand, if the content ratio of the matrix polymer is low, the concentration of the photoexcitation light emitting material increases and sufficient photoexcitation and diffusion of the light emitting sheet takes place, leading to an increase in the entire brightness of the light emitting layer. Therefore, in the present invention, the content ratio of the photoexcitation light emitting materials to the matrix polymer is maintained at a range from 0.01 to 20 wt %, specifically 0.1 to 10 wt %.

Further, the diameter of the ultrafine composite fiber of the matrix polymer/photoexcitation light emitting materials prepared by spinning has a significant effect on apparent porosity. That is, the apparent porosity of the ultrafine composite fiber layer accumulated on the transparent conductive substrate by spinning decreases in proportion to the diameter of the ultrafine composite fiber layer. This is because the pore size of the ultrafine composite fiber layer is reduced in proportion to the diameter of the fiber. If the apparent porosity of the photoexcitation light emitting layer formed by compressing such an ultrafine composite fiber layer at a certain temperature is low, sufficient photoexcitation and diffusion thereof take place, leading to an increase in brightness, while if the apparent porosity is high, the brightness deteriorates.

The apparent porosity of the ultrafine composite fiber layer formed on a transparent conductive substrate can be determined according to the following mathematical formula 1, while the thickness of the ultrafine composite fiber layer can be measured by using a surface profiler (TENCOR.P-10).

$$\text{Apparent porosity (\%)} = [(V - V_{nanofiber})/V] \times 100 \quad \text{[Mathematical Formula 1]}$$

wherein, V is the whole volume (thickness×surface area) of the ultrafine composite fiber layer; and $V_{nanofiber}$ is the volume of the ultrafine composite fiber layer which is determined by using the ideal mixed viscosity calculated from the content ratio of the matrix polymer/photoexcitation light emitting materials and each viscosity thereof, and the weight of the polymer/photoexcitation light emitting materials included in the ultrafine composite fiber layer.

Further, the morphology of the ultrafine composite fiber layer can be observed with a field emission scanning electron microscope (FE-SEM, HITACHIS-4100) and a high-resolution transmission electron microscope (HR-TEM, JEOL-JEM-2000EXII). The specific surface area of the ultrafine composite fiber layer can be determined according to a BET method using liquid nitrogen adsorption (Brunauer, P. H. Emmett and E. Teller, J. Am. Chem. Soc. 60: 309, 1938). The morphology of the ultrafine composite fiber layer obtained in the early stage of electrospinning according to the above method is shown in FIG. 2, and when the diameter of such ultrafine composite fiber is 100 nm, the specific surface area is 40 m$^2$/g.

The diameter of the ultrafine composite fiber layer according to the present invention can be determined by a variety of spinning process parameters including the viscosity of the photoexcitation light emitting composition, i.e., the content ratio of the matrix polymer to the solvent and the discharge rate. In one embodiment of the present invention, the content ratio of the matrix polymer to the solvent can be regulated so as to modulate the apparent porosity of the photoexcitation light emitting layer. For instance, the content ratio of the matrix polymer to the solvent may be in the range of 1 to 50 wt %, specifically 3 to 20 wt %. If the polymer content is not more than 1 wt %, the ultrafine composite fiber predominantly exists in the form of relatively short disconnected fibers or of a particle rather than in the form of an elongated fiber. If the polymer content exceeds 50 wt %, there are problems in terms of the spinning from the nozzle being unfeasible or the fibers having too large a diameter, which makes it difficult to control the apparent porosity.

In another embodiment of the present invention, the discharge rate of the spinning process can be regulated so as to modulate the apparent porosity of the photoexcitation light emitting layer. The discharge rate may be in the range of 1 µl/min to 500 µl/min, specifically 10 µl/min to 200 µl/min per spinning nozzle. If the discharge rate is not more than 1 µl/min, the productivity is too low, while if the discharge rate exceeds 500 µl/min, there are problems of forming too thick fibers and being difficult to control the apparent porosity. For example, when the spinning process is carried out at a high discharge rate ranging from 200 µl/min to 500 µl/min, a thick ultrafine composite fiber having a diameter of 1 micron or more is formed, resulting in the photoexcitation light emitting layer fabricated by compressing that ultrafine composite fiber exhibiting a very weak brightness. The ultrafine composite fiber prepared according to the above content ratio of the matrix polymer to the solvent and discharge rate has a diameter in the range of 10 to 10,000 nm, specifically 50 to 2,000 nm.

In addition, the apparent porosity of the photoexcitation light emitting layer can be modulated by regulating the compression ratio when the ultrafine composite fiber layer of the matrix polymer/photoexcitation light emitting materials prepared by the spinning process is compressed at a certain temperature. In another embodiment of the present invention, the ultrafine composite fiber layer is compressed at a compression ratio in the range of 0.1 to 20 ton/100 cm$^2$, specifically 0.1 to 10 ton/100 cm$^2$, so as to regulate the apparent porosity of the photoexcitation light emitting layer in the range of 5 to 70%.

Furthermore, the color coordinates of the photoexcitation light emitting layer according to the present invention can be modulated by regulating each content ratio of the photoexcitation light emitting materials. For example, when used a blue light emitting polymer, a green wavelength quantum dot and an orange wavelength quantum dot as the photoexcitation light emitting materials, the content ratio may be in the range of 1:0.1:0.1 to 1:10:10, specifically 1:0.6:0.6 to 1:5:5.

When the above mentioned methods are used in combination, the brightness of the photoexcitation light emitting sheet can be modulated by regulating the content ratio of the photoexcitation light emitting materials to the matrix polymer and the apparent porosity of the photoexcitation light emitting layer, and the color coordinates can be modulated by regulating each content ratio of the photoexcitation light emitting materials.

Further, the present invention provides a method of fabricating the above white and color photoexcitation light emitting sheet.

The fabrication method of the present invention may comprise the following steps:
1) preparing a white and color photoexcitation light emitting composition by mixing a matrix polymer, white and color photoexcitation light emitting materials, and a solvent;
2) spinning the white and color photoexcitation light emitting composition onto a substrate to form an ultrafine composite fiber layer of the matrix polymer/photoexcitation light emitting materials; and
3) thermocompressing the ultrafine composite fiber layer formed on the substrate to form a white and color photoexcitation light emitting layer.

Suitable photoexcitation light emitting materials for use in step 1) may include, but are not limited to, inorganic fluorescent materials, organic fluorescent materials, organic light emitting polymers, phosphor materials as a metal complex, quantum dots or their composite materials, and mixtures thereof, that all have one of blue, green, red and orange wavelengths. Further, the quantum dot composite materials may include cadmium selenide (CdSe), cadmium sulfide (CdS), zinc selenide (ZnSe), zinc sulfide (ZnS), zinc oxide (ZnO) and the like, but are not limited thereto.

For example, when a blue light emitting polymer, a green wavelength quantum dot and an orange wavelength quantum dot are used as photoexcitation light emitting materials, the content ratio may be in the range of 1:0.1:0.1 to 1:10:10. Further, when using a blue light emitting polymer, a green wavelength quantum dot and a red wavelength quantum dot, the content ratio may be in the range of 1:0.1:0.1 to 1:10:10.

Suitable matrix polymers for use in step 1) may be selected from the group consisting of polyurethane (PU), polyetherurethane, polyurethane copolymer, cellulose acetate, cellulose acetate butyrate, cellulose acetate propionate, polymethyl acrylate (PMA), polymethyl methacrylate (PMMA), polyacryl copolymer, polyvinylacetate (PVAc), polyvinylacetate copolymer, polyvinylalcohol (PVA), polyfurfurylalcohol (PPFA), polystyrene (PS), polystyrene copolymer, polyethylene oxide (PEO), polypropylene oxide (PPO), polyethyleneoxide copolymer, polypropylene oxide copolymer, polycarbonate (PC), polyvinylchloride (PVC), polycaprolactone (PCL), polyvinylpyrrolidone (PVP), polyvinylcarbazole (PVK), polyvinyllidenefluoride (PVdF), polyvinyllidenefluoride copolymer, polyamide, and any mixtures thereof.

Suitable solvents for use in step 1) may be selected from the group consisting of water, ethanol, methanol, acetone, tetrahydrofuran (THF), trifluorethylene, tetrachloroethylene (PCE), benzene, toluene, xylene, hexane, cyclohexane, kerosene, chloroform, trichloethylene, tetrachloethylene, dimethylformamide, and any mixtures thereof.

The content ratio of the matrix polymer to the solvent in step 1) may be in the range of 1 to 50 wt %, while that of the photoexcitation light emitting materials to the matrix polymer may be in the range of 0.01 to 20 wt %.

The substrate in step 2) may be a transparent conductive substrate, which may be in the form of a transparent glass substrate or a transparent flexible polymer substrate coated with a conductive thin film. Here, the conductive thin film may be a thin film coated with ITO (indium tin oxide), FTO (fluorine-doped tin oxide), ITO/ATO (antimony tin oxide), or ITO/FTO.

The spinning in step 2) may be carried out according to methods including, but not limited to, electrospinning, meltblown, electro-blown, flash spinning, and electrostatic meltblown.

The ultrafine composite fiber in step 2) may be an ultrafine composite fiber of the matrix polymer/photoexcitation light emitting materials having a diameter ranging from 10 to 10,000 nm.

In step 3), the ultrafine composite fiber layer is subjected to thermocompression for 30 seconds to 10 minutes at a temperature between the glass transition temperature (Tg) of the matrix polymer and the melting temperature (Tm) of the above matrix polymer, which is lower than 150° C., to form a white and color photoexcitation light emitting layer, while the compression ratio may be in the range of 0.1 ton/100 cm² to 20 ton/100 cm².

The white and color photoexcitation light emitting layer formed in step 3) may have a thickness in the range of 0.5 to 20 μm and an apparent porosity in the range of 5 to 70%. Further, the apparent porosity of the above white and color photoexcitation light emitting layer is modulated by regulating the diameter of the ultrafine composite fiber by controlling at least one of the viscosity of the above white and color photoexcitation light emitting composition and the discharge rate during the spinning process, by regulating the compression ratio during the thermocompression of the ultrafine composite fiber layer, or by a combination of the two methods.

In another embodiment of the present invention, a photoexcitation light emitting composition is first prepared as a spinning solution for electrospinning in order to form a photoexcitation light emitting layer.

In particular, polymethyl methacrylate having a high affinity for the photoexcitation light emitting materials that are being used is dissolved in tetrahydrofuran, toluene, benzene, or a mixture thereof to prepare a polymer solution exhibiting a viscosity of 1 to 50 wt %, which is suitable for electrospinning. Polymethyl methacrylate having an average molecular weight in the range of 100,000 to 1,000,000 g/mol may be used. Instead of polymethyl methacrylate, polyacryl copolymer, polystyrene, polystyrene copolymer, and the like may also be used to prepare the polymer solution. There is no limitation to the type of matrix polymer so long as its glass transition temperature (Tg) where the photoexcitation light emitting materials are stably compressed is lower than 150° C.

Next, a blue light emitting polymer, a green wavelength quantum dot and an orange wavelength quantum dot, as photoexcitation light emitting materials, are added to the polymer solution in the amount of 0.01 to 20 wt % based on the weight of polymethyl methacrylate, dissolved by ample stirring at 25 to 70° C. by using a magnetic bar, and then dispersed by a ultrasonic generator to prepare a photoexcitation light emitting composition as a spinning solution. Here, the content ratio of the blue light emitting polymer, green wavelength quantum dot and orange wavelength quantum dot used as the photoexcitation light emitting materials may be in the range of 1:0.6:0.6 to 1:5:5.

Then, the above prepared spinning solution is subjected to electrospinning onto a transparent conductive substrate by means of an electrospinning device as illustrated in FIG. 3, to thereby obtain an ultrafine composite fiber layer of the matrix polymer/photoexcitation light emitting materials.

Referring to FIG. 3, the electrospinning device is equipped with a spinning nozzle connected to a quantitative pump which is capable of quantitatively supplying the spinning solution, a high voltage generator, and a transparent conductive substrate on which the ultrafine composite fiber layer is formed. The grounded transparent conductive substrate, in particular, the transparent conductive substrate having a conductivity of 5 to 30Ω and coated with ITO or FTO is used as a cathode, and the spinning nozzle equipped with a pump which is capable of regulating the discharge amount by the hour is used as an anode. After a voltage of 8 to 30 KV is applied, electrospinning is carried out by regulating the discharge rate of the spinning solution in the range of 1 to 5,000 μl/min, thereby forming an ultrafine composite fiber layer of the matrix polymer/photoexcitation light emitting materials.

Subsequently, the ultrafine composite fiber layer formed on the transparent conductive substrate is subjected to thermocompression, to thereby form a white photoexcitation light emitting layer.

In particular, the thermocompression is carried out by applying a certain pressure to the transparent conductive substrate on which the ultrafine composite fibers of the matrix polymer/photoexcitation light emitting materials are formed at a temperature between the glass transition temperature (Tg) of the matrix polymer and the melting temperature (Tm) of the matrix polymer, to thereby form a white photoexcitation light emitting layer having a thickness of 0.5 to 20 μm. As such, a white photoexcitation light emitting sheet where the white photoexcitation light emitting layer is formed on the substrate is fabricated.

A white light emitting device can be prepared by applying the thus fabricated white photoexcitation light emitting sheet of the present invention to a light emitting source of an organic light emitting device. FIG. 5 is a schematic diagram illustrating such a white light emitting device, where a hole injection layer 32, a hole transport layer 33, a light emitting layer 34, an electron transport layer 35, an electron injection layer 36, and an anode layer 37 are sequentially formed on a cathode substrate 31, followed by covering with a protective film substrate 39 to which a humectant 38 is adhered for protection of the device. The photoexcitation light emitting layer including photoexcitation-diffusion light emitting materials 21 according to the present invention is then applied to the organic light emitting device 30 fabricated above, to thereby fabricate a white light emitting device.

In another embodiment of the present invention, a photoexcitation white light emitting device is fabricated by applying the white photoexcitation light emitting sheet according to the present invention to a blue light source of a blue organic light emitting device, where its color coordinates and emission spectrum are analyzed (see FIG. 6).

As described above, since the method of the present invention can uniformly mix and disperse the photoexcitation light emitting materials, it is possible to fabricate a white and color photoexcitation light emitting sheet having uniform brightness and color coordinates due to regular thickness. Further, since the method of the present invention can use various combinations of the photoexcitation light emitting materials capable of emitting a variety of colors including the primary colors of red, blue and green, complementary colors and the like, it can be effectively used for fabricating a white and color photoexcitation light emitting sheet whose brightness and color coordinates are easily regulated and color reproducibility is high.

Embodiments of the present invention will now be described in more detail with reference to the following examples. However, the examples are provided for the purpose of illustration and are not to be construed as limiting the scope of the invention.

EXAMPLES

Example 1

0.4 g of polymethyl methacrylate (PMMA, Mw 1,000,000, Aldrich) was added to 8 ml of toluene and completely dissolved at room temperature to thereby prepare a polymer solution. After a blue light emitting polymer (Dow Corning), a green wavelength quantum dot (CdSe.ZnS) and an orange wavelength quantum dot (CdSe.ZnS) were mixed in a weight ratio of 1:3:4, 0.004 g of the resulting mixture was added to the polymer solution and completely dissolved under stirring by means of a magnetic bar at room temperature. The resulting mixture was subjected to ultrasonic dispersion for 1 hour, to thereby prepare a spinning solution. The thus prepared spinning solution was subjected to electrospinning onto the surface of a transparent conductive substrate, to thereby form an ultrafine composite fiber layer of the polymethyl methacrylate/photoexcitation white light emitting materials. FIG. 2 depicts the surface of the ultrafine composite fiber layer formed above observed with a scanning electron microscope (SEM).

The electrospinning process was carried out by using an electrospinning device as illustrated in FIG. 3. In the electrospinning device, the transparent conductive substrate (5 cm×5 cm in size) coated with ITO was used as a grounded receiver and a metal needle equipped with a pump which is capable of regulating the discharge rate was used as a cathode. A voltage of 15 KV was applied between the two electrodes, and the distance of 12 cm from the tip of the nozzle to the surface of the transparent conductive substrate was maintained. The electrospinning was carried out by regulating the discharge rate of the spinning solution to 20 µl/min until the total discharge amount reached 1,000 µl, to thereby form an ultrafine composite fiber layer of the polymethyl methacrylate/photoexcitation white light emitting materials with a thickness of 3 µm on the surface of the transparent conductive substrate coated with ITO. The thus formed ultrafine composite fiber layer was subjected to thermocompression at 50□ for 10 minutes at a compression ratio of 2 ton/min, to thereby fabricate a white photoexcitation light emitting sheet with a thickness of 1 µm using a UV light source.

Example 2

0.4 g of polymethyl methacrylate (PMMA, Mw 1,000,000, Aldrich) was added to 8 ml of toluene and completely dissolved at room temperature, to thereby prepare a polymer solution. After a blue light emitting polymer (Dow Corning), a green wavelength quantum dot (CdSe.ZnS) and an orange wavelength quantum dot (CdSe.ZnS) were mixed in a weight ratio of 1:3:3.6, 0.004 g of the resulting mixture was added to the polymer solution and completely dissolved under stirring by means of a magnetic bar at room temperature. The resulting mixture was subjected to ultrasonic dispersion for 1 hour, to thereby prepare a spinning solution. The thus prepared spinning solution was subjected to electrospinning onto the surface of a transparent conductive substrate, to thereby form an ultrafine composite fiber layer of the polymethyl methacrylate/photoexcitation white light emitting materials.

The electrospinning was carried out under the same conditions as described in Example 1 above. As a result, a white photoexcitation light emitting sheet with a thickness of 1 µm using a UV light source was fabricated.

Example 3

0.4 g of polymethyl methacrylate (PMMA, Mw 1,000,000, Aldrich) was added to toluene 8 ml and completely dissolved at room temperature, to thereby prepare a polymer solution. After a green wavelength quantum dot (CdSe.ZnS) and an orange wavelength quantum dot (CdSe.ZnS) were mixed in a weight ratio of 1:1.2, 0.004 g of the resulting mixture was added to the polymer solution and completely dissolved under stirring by means of a magnetic bar at room temperature. The resulting mixture was subjected to ultrasonic dispersion for 1 hour, to thereby prepare a spinning solution. The thus prepared spinning solution was subjected to electrospinning onto the surface of a transparent conductive substrate, to thereby form an ultrafine composite fiber layer of the polymethyl methacrylate/photoexcitation white light emitting materials.

The electrospinning process was carried out by using an electrospinning device as illustrated in FIG. 3. In the electrospinning device, an ITO layer opposite to the blue organic light emitting device (OLED)(2.54 cm×2.54 cm) using a glass substrate coated with ITO on both sides thereof was used as a grounded receiver and a metal needle equipped with a pump which is capable of regulating a discharge rate was used as a cathode. A voltage of 15 KV was applied between the two electrodes, and a distance of 12 cm from the tip of the nozzle to the surface of the transparent conductive substrate was maintained. The electrospinning was carried out by regulating the discharge rate of the spinning solution to 20 µl/min until the total discharge amount reached 1,000 µl, to thereby form an ultrafine composite fiber layer of the polymethyl methacrylate/yellow light emitting materials with a thickness of 3 µm on the ITO layer opposite to the blue organic light emitting device. The thus formed ultrafine composite fiber layer was subjected to thermocompression at 50□ for 10 minutes at a compression ratio of 0.5 ton/min. For protection of the blue organic light emitting device, a bar having a uniform thickness was applied to the perimeter of the device. As such, a white photoexcitation light emitting sheet with a thickness of 0.8 µm using a blue light source was fabricated.

Example 4

In order to examine the light emitting properties of the photoexcitation light emitting sheet according to the present invention, the emission spectrum was analyzed after a UV light source having a wavelength of 365 in was applied to the white photoexcitation light emitting sheet fabricated in Example 1 above. As a result, as shown in FIG. 4, the emission spectrum of the white photoexcitation light emitting sheet according to the present invention exhibited three peaks at wavelengths of 433 nm, 517 nm and 556 nm, respectively, and exhibited white light emission. The color coordinates were located at (0.31, 0.276).

FIG. 5 is a schematic diagram illustrating a white light emitting device where the white photoexcitation light emitting sheet fabricated in Example 3 is applied to a light emitting source of an organic light emitting device. The white light emitting device was fabricated by forming the white photoexcitation light emitting sheet of the present invention on the opposite side of the substrate of a blue organic light emitting device.

FIG. 6 depicts the color coordinates of a white light emitting device where the white photoexcitation light emitting sheet according to the present invention is applied to a blue light source of a blue organic light emitting device. While the color coordinates of the blue organic light emitting device where the white photoexcitation light emitting sheet according to the present invention was not applied were located at (0.15, 0.16), those of the blue organic light emitting device where the white photoexcitation light emitting sheet according to the present invention was applied were located at (0.30, 0.35) and exhibited white light emission.

While the present invention has been described and illustrated with respect to various embodiments of the invention, it will be apparent to those skilled in the art that variations and modifications are possible without deviating from the broad principles and teachings of the present invention, which should be limited solely by the scope of the claims appended hereto.

What is claimed:

1. A white and color photoexcitation light emitting device comprising a substrate, a light source formed on the substrate, and a white and color photoexcitation light emitting layer for converting a light emitted from the light source into a light having a different wavelength, wherein the white and color photoexcitation light emitting layer is fabricated by mixing a matrix polymer, white and color photoexcitation light emitting materials and a solvent, spinning the resulting mixture to prepare an ultrafine composite fiber layer of the matrix polymer and photoexcitation light emitting materials, and thermocompressing the ultrafine composite fiber layer.

2. The white and color photoexcitation light emitting device according to claim 1, wherein the light source is a lamp or a light emitting device including an organic light emitting device (OLED) and an inorganic light emitting device (LED), which emits light having a single ultraviolet wavelength or a single blue wavelength.

3. The white and color photoexcitation light emitting device according to claim 1, wherein the white and color photoexcitation light emitting materials are selected from the group consisting of inorganic fluorescent materials, organic fluorescent materials, organic light emitting polymers, phosphor materials as a metal complex, quantum dots and their composite materials, and mixtures thereof, that all have one of blue, green, red and orange wavelengths.

4. The white and color photoexcitation light emitting device according to claim 1, wherein the substrate is a transparent glass substrate or a transparent flexible polymer substrate which is coated with a conductive thin film.

5. The white and color photoexcitation light emitting device according to claim 4, wherein the conductive thin film is a thin film coated with one of ITO (indium tin oxide), FTO (fluorine-doped tin oxide), ITO/ATO (antimony tin oxide), and ITO/FTO.

6. The white and color photoexcitation light emitting device according to claim 1, wherein the white and color photoexcitation light emitting layer has a thickness ranging from 0.5 to 20/cm.

* * * * *